United States Patent
Ashita (10) Patent No.: US 9,077,298 B2
(45) Date of Patent: Jul. 7, 2015

(54) SAMPLING CIRCUIT, COMMUNICATION DEVICE, DISTORTION CORRECTION CIRCUIT, SIGNAL SAMPLING METHOD, AND PROGRAM

(75) Inventor: Junya Ashita, Tokyo (JP)

(73) Assignee: NEC CORPORATION, Tokyo (JP)

( * ) Notice: Subject to any disclaimer, the term of this patent is extended or adjusted under 35 U.S.C. 154(b) by 267 days.

(21) Appl. No.: 13/392,921

(22) PCT Filed: Aug. 26, 2010

(86) PCT No.: PCT/JP2010/064461
§ 371 (c)(1),
(2), (4) Date: Feb. 28, 2012

(87) PCT Pub. No.: WO2011/030672
PCT Pub. Date: Mar. 17, 2011

(65) Prior Publication Data
US 2012/0163498 A1 Jun. 28, 2012

(30) Foreign Application Priority Data
Sep. 10, 2009 (JP) .................. 2009-209216

(51) Int. Cl.
| | |
|---|---|
| H04K 1/02 | (2006.01) |
| H04L 25/03 | (2006.01) |
| H04L 25/49 | (2006.01) |
| H03F 1/32 | (2006.01) |
| H03F 3/189 | (2006.01) |
| H03F 3/24 | (2006.01) |
| H04L 27/36 | (2006.01) |

(52) U.S. Cl.
CPC ............ *H03F 1/3247* (2013.01); *H03F 1/3294* (2013.01); *H03F 3/189* (2013.01); *H03F 3/24* (2013.01); *H03F 2200/336* (2013.01); *H03F 2200/451* (2013.01); *H04L 27/368* (2013.01)

(58) Field of Classification Search
None
See application file for complete search history.

(56) References Cited

U.S. PATENT DOCUMENTS

| | | | | |
|---|---|---|---|---|
| 2002/0048326 | A1* | 4/2002 | Sahlman | 375/297 |
| 2004/0019836 | A1* | 1/2004 | Kiukkonen et al. | 714/701 |
| 2006/0232332 | A1* | 10/2006 | Braithwaite | 330/149 |
| 2008/0055000 | A1 | 3/2008 | Haramoto et al. | |
| 2009/0279641 | A1* | 11/2009 | Aoki et al. | 375/298 |

FOREIGN PATENT DOCUMENTS

| | | |
|---|---|---|
| JP | 2000-059330 | 2/2000 |
| JP | 2000-278190 | 10/2000 |

(Continued)

OTHER PUBLICATIONS

International Search Report, PCT/JP2010/064461, Oct. 26, 2010.

*Primary Examiner* — Shuwang Liu
*Assistant Examiner* — Gina McKie
(74) *Attorney, Agent, or Firm* — Young & Thompson (57) ABSTRACT

A sampling circuit samples a transmission signal containing a particular transmission signal transmitted in a regular and intermittent transmission pattern. The sampling circuit includes a sampling processing unit that performs a sampling process that samples the transmission signal; a determination unit that determines whether the sampling process has been successfully or unsuccessfully performed; and a sampling control unit that sets up sampling acquisition intervals for the sampling processing unit in which the intervals differ depending on whether the sampling process is successfully or unsuccessfully, the sampling processing unit performing the sampling process based on the sampling acquisition interval that has been set up by the sampling control unit.

14 Claims, 5 Drawing Sheets

(56) References Cited

FOREIGN PATENT DOCUMENTS

| | | |
|---|---|---|
| JP | 2001-189685 | 7/2001 |
| JP | 2001-345779 | 12/2001 |
| JP | 2004-242191 | 8/2004 |
| JP | 2004-350230 | 12/2004 |
| JP | 2006-211701 | 8/2006 |
| JP | 2008-099340 | 4/2008 |
| JP | 2009-141818 | 6/2009 |
| JP | 2009-194435 | 8/2009 |

* cited by examiner

SAMPLING CIRCUIT, COMMUNICATION DEVICE, DISTORTION CORRECTION CIRCUIT, SIGNAL SAMPLING METHOD, AND PROGRAM

TECHNICAL FIELD

The present invention relates to technologies that serve to sample a transmission signal for a communication device used in a radio communication system.

BACKGROUND ART

As a distortion correction technology that has been widely used in recent years, a digital pre-distortion scheme is known.

The digital pre-distortion scheme serves to correct nonlinear distortion that occurs in electric power amplifiers and that has been used in envelope detection type linear analyzers presented in Patent Literature 1.

Concretely, in the digital pre-distortion scheme, a transmission signal inputted to a power amplifier and a feedback signal of a signal outputted from the power amplifier are compared with respect to their amplitudes and phases and then a distortion correction coefficient that represents the invert characteristic of a nonlinear characteristic of the electric power amplifier is obtained based on the comparison result, and then a complex-multiplication is performed for the transmission signal and the obtained distortion correction coefficient. The resultant complex-multiplied signal is inputted to the power amplifier and thereby the nonlinear distortion is corrected.

To perform the comparison process for the transmission signal and the feedback signal, their timings need to match. To match the timings of the transmission signal and the feedback signal, a method as presented in Patent Literature 2 is known in which the time lag between the transmission signal and the feedback signal is changed at each sampling period, the correlation value between the transmission signal and the feedback signal is computed, the delay time is decided based on the maximum correlation value of the obtained correlation values, and then the timings of the transmission signal and the feedback signal are matched using the decided delay time.

RELATED ART LITERATURE

Patent Literature

Patent Literature 1: JP 2000-278190 A
Patent Literature 2: JP 2001-189685 A

SUMMARY OF THE INVENTION

Problem to be Solved by the Invention

According to the digital pre-distortion scheme, in the comparison process for the transmission signal and the feedback signal, the envelopes of individual signals are detected and these signals are compared using the detected envelops. Thus, the signals need to be sampled at high rates as the changes of the envelopes can be detected.

When signals are sampled at such high rates, since the memory and processing periods are restricted, sampling regions in which signals are sampled become very short. In addition, since the envelopes of signals are detected, sampled data in signal absent regions are invalid and therefore only sampled data in signal present regions are required.

Figure 1:
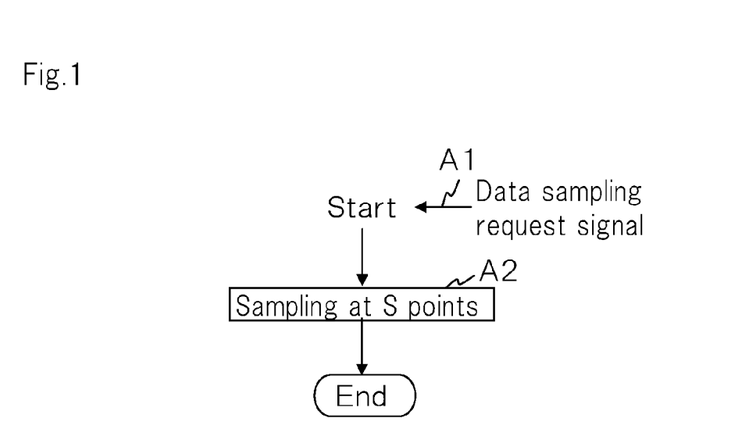
FIG. 1 is a flow chart describing an ordinary signal sampling method.

As an ordinary signal sampling method, a method shown in FIG. 1 is known. In this method, signal sampling is started corresponding to a data sampling request signal (at step A1) and the signal sampling is stopped when data at S point are sampled (at step A2). In the figure, "S" represents a pre-set value.

On the other hand, in LTE (Long Term Evolution) that has been evaluated as a next generation access scheme in recent years, adopting OFDMA (Orthogonal Frequency Division Multiple Access) that uses the orthogonality of frequencies as a modulation scheme so as to improve the frequency usage efficiency has been tried.

LTE is a multi-carrier system that divides the frequency domain into a plurality of subcarriers unlike a single carrier system such as CDMA (Code Division Multiple Access).

In OFDMA, resource scheduling that preferentially allocates resource blocks in the frequency domain and the time domain to users who need real time communication is considered. Alternatively, resource blocks might be preferentially allocated to users having a good transmission environment.

Figure 2:
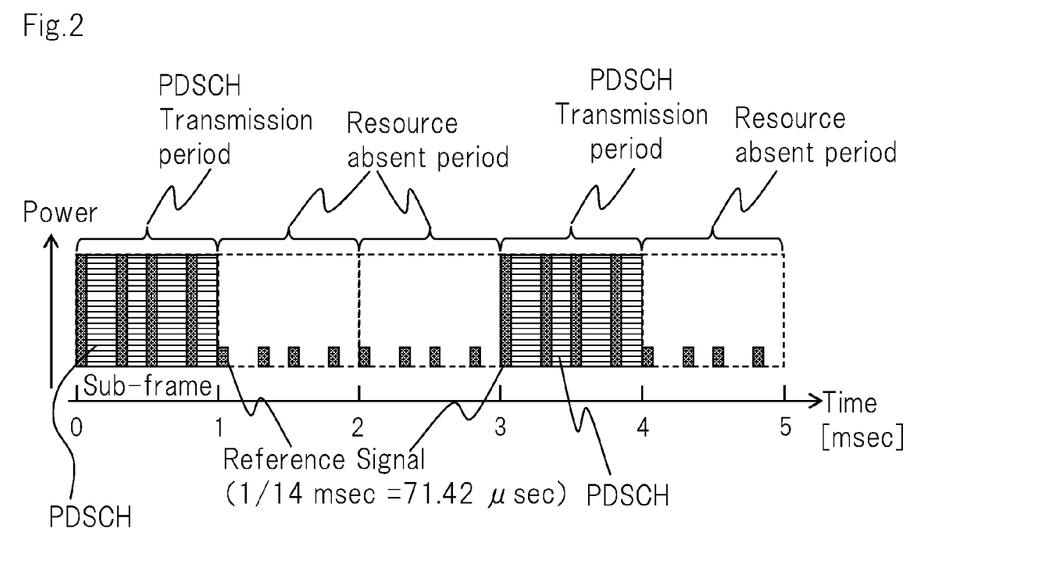
FIG. 2 is a schematic diagram describing an example of radio resource scheduling in the time domain of OFDMA.

FIG. 2 is a schematic diagram describing an example of resource scheduling that allocates resource blocks in the time domain of OFDMA. In FIG. 2, resource blocks are allocated in subframes (1 [msec] for LTE) in the time domain.

In the resource scheduling shown in FIG. 2, PDSCH (Physical Downlink Shared Channel) that is composed of a downlink signal is allocated as a resource block in each subframe. At this point, a transmission signal in a subframe where PDSCH is not allocated has a transmission pattern in which only a pilot reference signal is intermittently transmitted. Hereinafter, the period in which PDSCH is allocated in a subframe is referred to as the PDSCH transmission period, whereas the period in which PDSCH is not allocated in a subframe is referred to as the resource absent period.

In LTE, it takes a signal time period of $1/14$ [msec] which is one symbol (=71.42 [μsec]) to transmit a reference signal. A reference signal is also a signal that the mobile station uses to measure CQI (Channel Quality Indicator) and that needs to be transmitted from the base station before a resource block of PDSCH is allocated for resource scheduling. Thus, in a subframe where PDSCH is not allocated, a reference signal is transmitted.

Likewise, before a resource block of PDSCH is allocated, the base station transmits P-SS (Primary Synchronization Signal) and S-SS (Secondary Synchronization Signal) and also transmits signals of PDCCH (Physical Downlink Control Channel), PCFICH (Physial Control Format Indictor Channel), and PHICH (Physical Hybrid ARQ Indicator Channel). At this point, since P-SS is always mapped, followed by S-SS, these signals need a signal time period for two symbols. In addition, since PDCCH, PCFICH, and PHICH are mapped to the first N symbols (where N is a maximum of 4) of each subframe, signals transmitted on these channels need a signal time period for one symbol or more. Thus, it can be assumed that the signal time period becomes the smallest in a subframe when only a reference signal is intermittently transmitted such as the resource absent period shown in FIG. 2.

Figure 3:
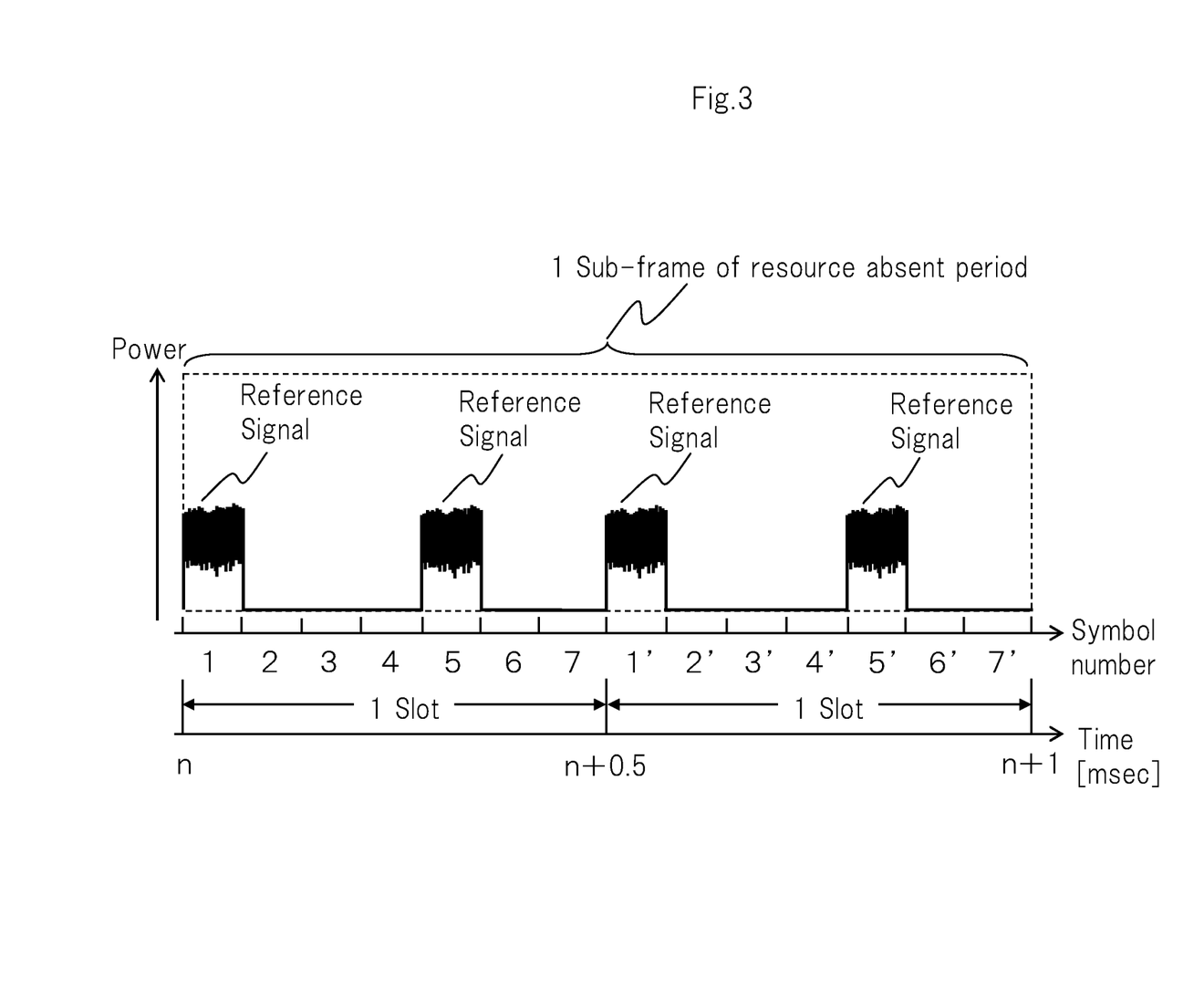
FIG. 3 is a schematic diagram describing an example of symbol positions at which a reference signal is present in the time domain of OFDMA.

Next, with reference to FIG. 3, an example of the symbol position of a reference signal in the time domain of OFDMA will be described. FIG. 3 shows one subframe that is present in the resource absent period shown in FIG. 2.

3GPP TS (3rd Generation Partnership Project Technical Specification) 36.211 dictates several mapping patterns of a reference signal. FIG. 3 shows that a reference signal is mapped by a normal cyclic prefix of such mapping patterns.

In other words, in this example, one subframe of OFDMA (1 [msec]) is composed of two slots (one slot is 0.5 [msec]), each slot has seven symbols, and a reference signal is mapped to the first and fifth symbols.

When the communication device performs a signal process using the envelope of a transmission signal as typified by the digital pre-distortion scheme, as described above, the transmission signal needs to be sampled at high rates as the changes of the envelope can be detected.

Figure 4:
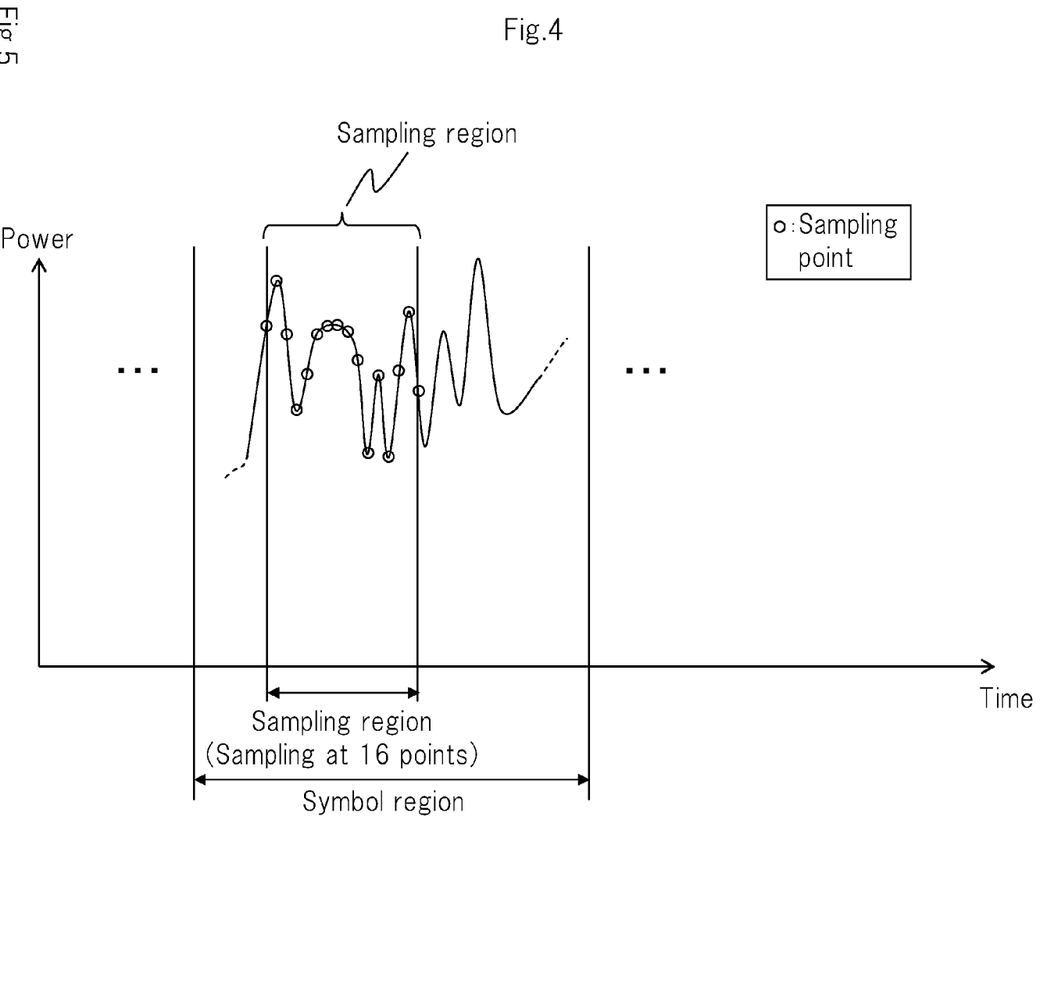
FIG. 4 is a schematic diagram showing an example of a sampling region and a symbol region in a case in which changes of an envelope are detected.

Thus, as shown in FIG. 4, the sampling region is normally shorter than the region of one symbol. FIG. 4 shows an example in which a signal is sampled at 16 points. In this case, if the signal is sampled corresponding to the signal sampling method shown in FIG. 1, a region in which a transmission signal is not present at all may be sampled depending on the timing of the data sampling request signal. In addition, if the data sampling request signal repetitively occurs at a particular constant interval, it is likely that only regions in which the transmission signal is not present are sampled.

For example, in the example shown in FIG. 3, when the interval of the data sampling request signal that occurs is seven symbols, if the first data sampling request signal occurs at the position of the second symbol, regions in which the transmission signal is not present are always sampled.

In the ordinary signal sampling method shown in FIG. 1, if the transmission signal has an intermittent transmission pattern such as the OFDMA resource absent period, since regions in which the transmission signal is not present at all may be sampled, valid sampled data cannot be obtained and thereby it may take a long time and occasionally necessary signal processes may not be completed. This would result in a fatal defect in the radio communication system in which real time characteristics are important.

Thus, when the communication device performs a signal process using the envelope of a transmission signal, even if the transmission signal has an intermittent transmission pattern like the OFDMA resource absent period, it is becoming important to ensure that the transmission signal is sampled in an optimum processing period.

Therefore, an object of the present invention is to solve the foregoing problem and provide a sampling circuit, a communication device, a distortion correction circuit, a signal sampling method, and a program that ensure that a transmission signal is sampled in an optimum processing period even if the transmission signal has an intermittent transmission pattern.

Means that Solve the Problem

The sampling circuit of the present invention is a sampling circuit that is used for a communication device and that samples a transmission signal containing a particular transmission signal transmitted in a regular and intermittent transmission pattern, comprising:

a sampling processing unit that performs a sampling process that samples said transmission signal;

a determination unit that determines whether said sampling process has been successfully or unsuccessfully performed; and a sampling control unit that sets up sampling acquisition intervals that differ depending on whether said sampling process has been successfully or unsuccessfully performed to said sampling processing unit, wherein said sampling processing unit performs the sampling process based on the sampling acquisition interval that has been set up by said sampling control unit.

A communication device of the present invention, comprising:

said sampling circuit;

an envelope detection circuit that detects an envelope of said transmission signal based on data sampled by said sampling circuit; and a signal processing circuit that performs a particular signal process using the envelope detected by said envelope detection circuit.

A signal sampling method of the present invention is a signal sampling method that is used for a communication device and that samples a transmission signal containing a particular transmission signal transmitted in a regular and intermittent transmission pattern, comprising:

a first processing step that performs a sampling process that samples said transmission signal;

a determination step that determines whether said sampling process has been successfully or unsuccessfully performed;

a setup step that sets up sampling acquisition intervals that differ depending on whether said sampling process has been successfully or unsuccessfully performed; and a second processing step that performs the sampling process based on the sampling acquisition interval that has been set up.

A program of the present invention causes a communication device that samples a transmission signal containing a particular transmission signal transmitted in a regular and intermittent transmission pattern to execute procedures, comprising:

a first processing procedure that performs a sampling process that samples said transmission signal;

a determination procedure that determines whether said sampling process has been successfully or unsuccessfully performed;

a setup procedure that sets up sampling acquisition intervals that differ depending on whether said sampling process has been successfully or unsuccessfully performed; and a second processing procedure that performs the sampling process based on the sampling acquisition interval that has been set up.

Effect of the Invention

According to the present invention, the sampling circuit sets up sampling acquisition intervals that differ depending on whether a sampling process has been successfully or unsuccessfully performed and performs the sampling process based on the sampling acquisition interval that has been set up.

Thus, since the sampling acquisition interval is set up such that regions in which a particular transmission signal is present can be sampled in the next sampling process, an effect that ensures that a transmission signal can be sampled in an optimum processing period can be obtained.

BEST MODES THAT CARRY OUT THE INVENTION

Hereinafter, with reference to the accompanying drawings, embodiments of the present invention will be described.

Figure 5:
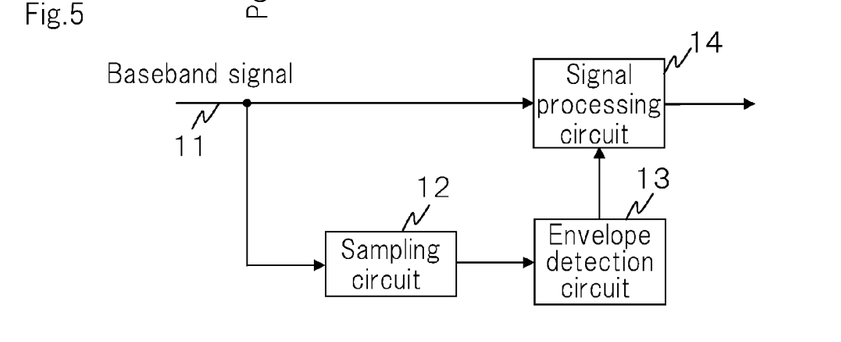
FIG. 5 is a block diagram showing the structure of principal units of a communication device according to an embodiment of the present invention.

FIG. 5 is a block diagram showing the structure of principal units of a communication device according to an embodiment of the present invention. In other words, FIG. 5 shows the structure of units that are dedicated in the communication device to perform a signal process using the envelope of a transmission signal. Moreover, in FIG. 5, it is assumed that a transmission signal to be sampled is a baseband signal containing, as a particular transmission signal, a reference signal transmitted in a regular and intermittent transmission pattern as shown in FIG. 2 and FIG. 3.

As shown in FIG. 5, the communication device according to this embodiment is provided with sampling circuit 12, envelope detection circuit 13, and signal processing circuit 14.

When a data sampling request signal is input from a control circuit (not shown) that controls the entire communication device to sampling circuit 12, it performs a sampling process that samples baseband signal 11 that has been branched at its input end.

Envelope detection circuit 13 detects the envelope of baseband signal 11 based on the data sampled by sampling circuit 12.

Signal processing circuit 14 performs a particular transmission signal process for baseband signal 11, which is a main signal system, based on the envelope detected by envelope detection circuit 13. In this context, the particular transmission signal process is, for example, a process for digital pre-distortion scheme distortion correction that compares a transmission signal and a feedback signal and that obtains a distortion correction coefficient based on the comparison result.

Figure 6:
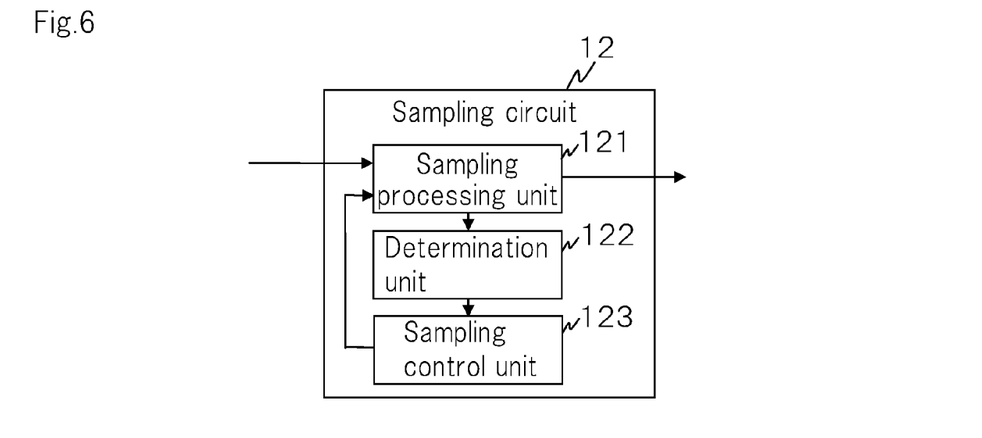
FIG. 6 is a block diagram showing the structure of a sampling circuit shown in FIG. 5.

FIG. 6 is a block diagram showing the structure of sampling circuit 12.

As shown in FIG. 6, sampling circuit 12 is provided with sampling processing unit 121, determination unit 122, and sampling control unit 123.

Sampling processing unit 121 performs a sampling process that samples baseband signal 11.

Determination unit 122 determines whether the sampling process has been successfully or unsuccessfully performed by sampling processing unit 121 based on the power value of the data sampled by sampling processing unit 121.

Sampling control unit 123 sets up sampling acquisition intervals for sampling processing unit 121 in which the intervals differ depending on whether the determination result of determination unit 122 is successful or unsuccessful. Thus, sampling processing unit 121 performs the next sampling process after the sampling acquisition interval that has been set up by sampling control unit 123.

Concretely, if the determination result of the sampling process is successful, sampling control unit 123 sets up the sampling acquisition interval for a period in which the reference signal is regularly mapped in the reference signal pattern. For example, as shown in FIG. 3, when the reference signal is mapped to the same symbol positions of each slot, since the reference signal is regularly mapped at a period of one slot from the symbol position, the sampling acquisition interval is set up for the interval of symbols of one slot. When the reference signal is mapped to the same symbol positions of even-numbered slots or odd-numbered slots, since the reference signal is regularly mapped at a period of two slots from the symbol position, the sampling acquisition interval is set up for the interval of symbols of two slots.

If the sampling process has been unsuccessfully performed by sampling processing unit 121 a predetermined number of times in succession, sampling control unit 123 causes sampling processing unit 121 to forcibly terminate the sampling process.

Hereinafter, with reference to FIG. 7, the signal sampling method performed by sampling circuit 12 according to this embodiment will be described.

It is assumed that corresponding to the data sampling request signal that is inputted, I and Q of baseband signal 11 are sampled for S pieces each in succession, the average power value of S pieces of sampled data ($=\Sigma(I^2+Q^2)/S$) is calculated, then S pieces of sampled data whose average power value is equal to or greater than the power threshold are obtained n times. In other words, the sampling process that obtains S pieces of sampled data is repeated until the process has succeeded n times. However, it is necessary to forcibly terminate the process if the average power value of S pieces of sampled data is lower than the power threshold a times in succession so as to prevent a situation in which the process is not completed even after it is repeated any number of times, for example, stopping the transmission signal. The foregoing "S," "power threshold," "n," and "α" are preset values.

Figure 7:
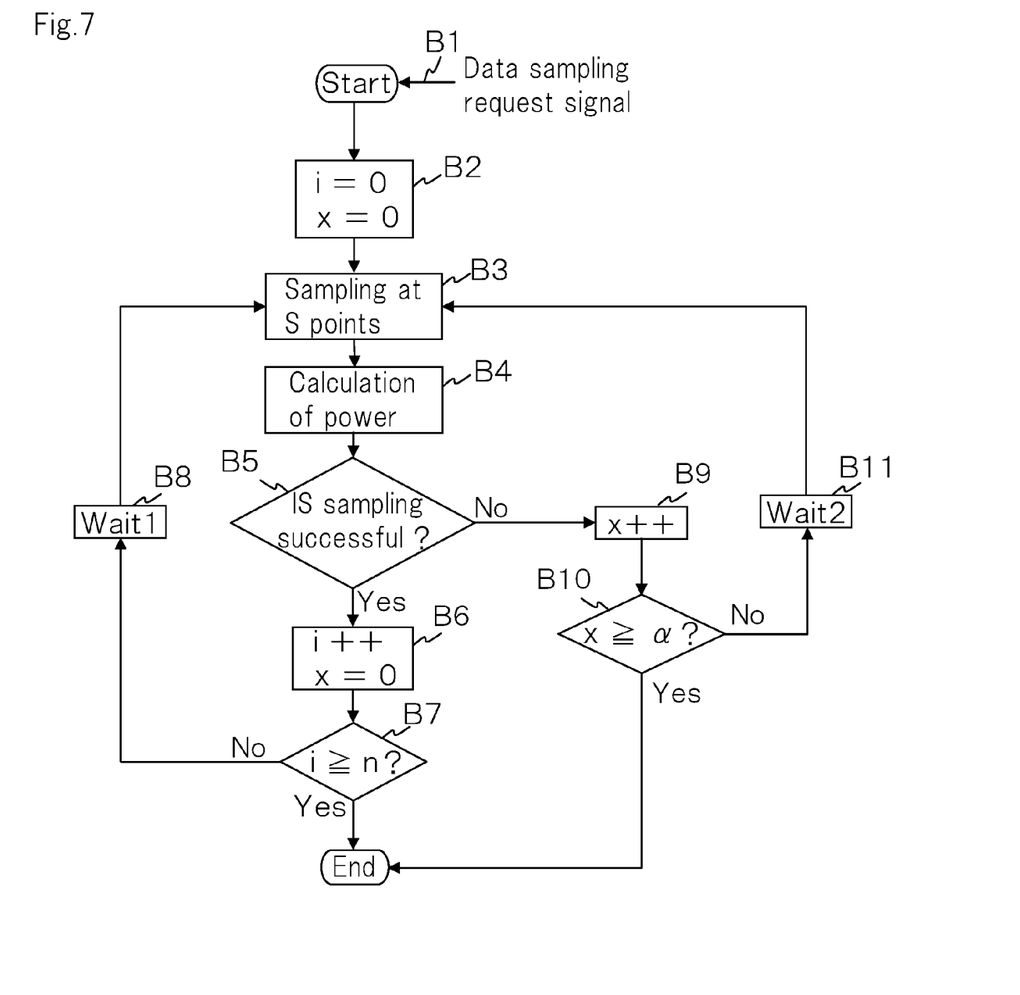
FIG. 7 is a flow chart describing a signal sampling method performed by the sampling circuit shown in FIG. 5 and FIG. 6.

As shown in FIG. 7, when the data sampling request signal is input at step B1, sampling control unit 123 clears the number of successful times of sampling process, i, and the number of unsuccessful times of sampling process, x, to 0.

Thereafter, sampling processing unit 121 performs the sampling process that samples I and Q of baseband signal 11 for S pieces each in succession at step B3.

Thereafter, determination unit 122 calculates the average power value of S pieces of sampled data, ($=\Sigma(I^2+Q^2)/S$) at step B4, compares the average power value with the preset power threshold at step B5, and determines that the sampling process is successful if the average power value is equal to or greater than the power threshold and that it is unsuccessful if the average power value is smaller than the power threshold.

If the determination result of the sampling process is successful at step B5, sampling control unit 123 increments the number of successful times of sampling process, i, by 1 at step B6 and clears the number of unsuccessful times of sampling process, x, to 0. Thereafter, sampling control unit 123 determines whether or not the number of successful times of sampling process, i, is equal to or greater than n at step B7 and then causes sampling processing unit 121 to terminate the sampling process if i is equal to or greater than n or sets up sampling acquisition interval Wait1 for successful sampling process to sampling processing unit 121 if i is smaller than n at step B8. After sampling acquisition interval Wait1, sampling processing unit 121 returns to step B3 again and performs the next sampling process.

In contrast, if the determination result of the sampling process at step B5 is unsuccessful, sampling control unit 123 increments the number of unsuccessful times of sampling process, x, by 1 at step B9 and then determines whether or not the sampling process has been unsuccessfully performed α times in succession at step B10, namely whether or not the number of unsuccessful times of sampling process, x, is equal to or greater than α. If x is equal to or greater than α, sampling control unit 123 causes sampling processing unit 121 to forcibly terminate the sampling process; if x is smaller than α, sampling control unit 123 sets up sampling acquisition interval Wait2 for unsuccessful sampling process for sampling processing unit 121 at step B11. After sampling acquisition interval Wait2, sampling processing unit 121 returns to step B3 again and performs the next sampling process.

Next, concrete examples of sampling acquisition intervals (foregoing Wait1 and Wait2) that depend on the determination result of the sampling process will be described.

Here, the case in which the reference signal contained in baseband signal 11 has a transmission pattern as shown in FIG. 3 will be described. In other words, in this example, one subframe of OFDMA (1 [msec]) is composed of two slots (one slot is 0.5 [msec]), each slot has seven symbols, and the reference signal is mapped to the first and fifth symbols.

This embodiment uses the characteristic in which the reference signal has a regular transmission pattern in such a manner that a particular sampling acquisition interval is set up depending on the determination result of the sampling process, the interval in which the next sampling process is performed is adjusted, and thereby regions in which the reference signal is present can be sampled.

In the example shown in FIG. 3, if the determination result of the sampling process is successful, sampling acquisition interval Wait1 after the sampling process is performed until the next sampling process is performed is set up for an interval of seven symbols. In contrast, if the determination result of the sampling process is unsuccessful, sampling acquisition interval Wait2 after the sampling process is performed until the next sampling process is performed is set up for an interval of six symbols. As a result, the transmission signal can be successfully sampled at a symbol position of the reference signal when the sampling process has been performed up to four times. Hereinafter, the reason why sampling acquisition intervals Wait1 and Wait2 need to be set up will be described.

For example, if the sampling process is performed at symbol position "1" shown in FIG. 3, since the reference signal is sampled, the determination result of the sampling process is successful. In this case, when the next sampling process is performed at symbol position "1'" preceded by symbol position "1" by seven symbols, the reference signal can be sampled again. Thus, taking into consideration the period necessary to obtain the determination result of the sampling process, the timing during which the next sampling process is performed is adjusted to seven symbols (adjusted at step B8 "Wait 1" shown in FIG. 7).

If the sampling process is performed at symbol position "2" shown in FIG. 3, since a region in which the signal is not present is sampled, the determination result of the sampling process is unsuccessful. In this case, if the sampling process is performed at symbol position "1'" preceded by symbol position "1" by six symbols, the reference signal can be sampled. Thus, taking into consideration the period necessary to obtain the determination result of the sampling process, the timing during which the next sampling process is performed is adjusted to six symbols (adjusted at step B11"Wait 2" shown in FIG. 7).

If the sampling process is performed at symbol position "3" shown in FIG. 3, since a region in which the signal is not present is sampled, the determination result of the sampling process is unsuccessful. In this case, if the next sampling process is performed at symbol position "1'" preceded by symbol position "1" by five symbols, the reference signal can be sampled. However, since sampling circuit 12 does not know at which symbol the determination result of the sampling process is unsuccessful, it cannot consider a sampling acquisition interval corresponding to the symbol position. Thus, such as the case in which the sampling process is performed at symbol position "2," if the timing for which the next sampling process is performed is adjusted to six symbols, since the next sampling process is performed at symbol position "2'," the determination result of the sampling process becomes unsuccessful. However, if the timing during which the next sampling process is performed is adjusted to six symbols, the reference signal can be sampled at symbol position "1" of the next subframe.

For the reason, in the example shown in FIG. 3, if the determination result of the sampling process is successful, sampling acquisition interval Wait1 is set up for seven symbols; if the determination result of the sampling process is unsuccessful, sampling acquisition interval Wait2 is set up for six symbols. Thus, the reference signal can always be sampled when the sampling process has been performed up to four times.

In the example shown in FIG. 3, if the determination result of the sampling process is unsuccessful, sampling acquisition interval Wait2 is not limited to six symbols; instead, as long as the sampling acquisition interval is a multiple of one symbol (1, 2, 3, 4, 5, 6, and their multiples), the sampling acquisition interval may be other values (except for multiples of seven symbols). However, in this case, the reference signal may not be sampled until the sampling process has been performed up to six times. When a period after the sampling process is performed until the next sampling process is performed is shorter than one symbol, if sampling acquisition interval Wait2 is set up for one symbol, the reference signal can be sampled at a symbol position when the sampling process has been performed up to four times and thereby the reference signal can be sampled at a symbol position in a shorter period than that case in which sampling acquisition interval Wait2 is set up for six symbols.

As described above, according to this embodiment, sampling circuit 12 sets up sampling acquisition intervals that differ depending on whether the sampling process is successful or unsuccessful and performs the next sampling process after the sampling acquisition interval that has been set up.

Thus, when a sampling acquisition interval is set up such that a region in which the reference signal that is always contained in the resource absent period of OFDMA is present is sampled, an effect that ensures that the transmission signal is sampled in an optimum processing period can be obtained.

More concretely, if the sampling process has been successfully performed by sampling circuit 12, the sampling acquisition interval is set up for a period in which the reference signal has been regularly mapped and thereby sampling circuit 12 can sample a region in which the reference signal has been mapped in the next sampling process. Since the sampling acquisition interval in the case that the sampling process is successful is different from that in the case in which the sampling process is unsuccessful, sampling circuit 12 can sample a region in which the reference signal has been mapped when it has performed the sampling process a particular number of times.

In addition, according to this embodiment, if sampling circuit 12 has failed to perform the sampling process a predetermined number of times in succession, it is caused to forcibly terminate the sampling process.

Thus, if the sampling process is not completed, after it has been performed for any number of times for a reason, such as the transmission signal is stopped, an effect that ensures that the sampling process is forcibly terminated and that thereby prevents from being idly repeated can be obtained.

Hereinafter, with reference to FIG. 8, the structure in which the communication device according to the embodiment shown in FIG. 5 is applied to a radio transmission device that is provided with a digital pre-distortion scheme distortion correction circuit will be described.

Figure 8:
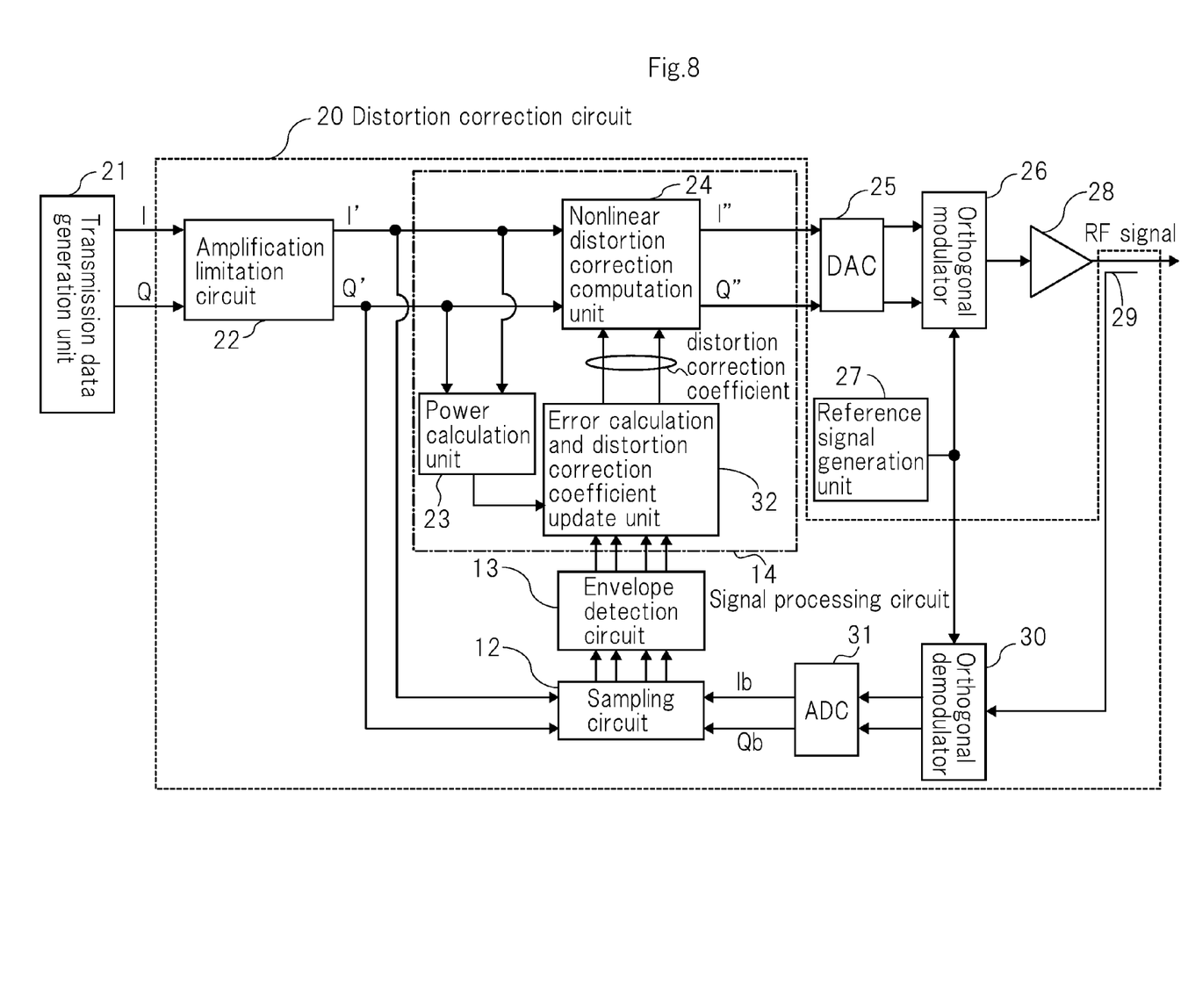
FIG. 8 is a block diagram showing the structure in which the communication device according to the embodiment shown in FIG. 5 is applied to a radio transmission device provided with a digital pre-distortion scheme distortion correction circuit.

As shown in FIG. 8, this radio transmission device is provided with distortion correction circuit 20, transmission data generation unit 21, DAC (Digital-Analog Converter) 25, orthogonal modulator 26, reference signal generation unit 27, and power amplifier 28. Distortion correction circuit 20 is composed of amplification limitation circuit 22, power calculation unit 23, nonlinear distortion correction computation unit 24, directional coupler 29, orthogonal demodulator 30, ADC (Analog-Digital Converter) 31, sampling circuit 12, envelope detection circuit 13, and error calculation and distortion correction coefficient update unit 32. In FIG. 8, similar constituent units to those in FIG. 5 are denoted by similar reference numerals; signal processing circuit 14 shown in FIG. 5 corresponds to power calculation unit 23, nonlinear distortion correction computation unit 24, and error calculation and distortion correction coefficient update unit 32 shown in FIG. 8.

Transmission data generation unit 21 generates digital orthogonal baseband signals I and Q.

Amplification limitation circuit 22 limits the amplitudes of the digital orthogonal baseband signals I and Q that are outputted from transmission data generation unit 21 such that their amplitudes become equal to or lower than particular power threshold Pth. As ordinary amplitude limitation methods, circular clipping amplitude limitation method and window function based amplitude limitation method are well known. In this example, one of these methods can be used.

Nonlinear distortion correction computation unit 24 performs a distortion correction computation using a complex-multiplication based on a pre-calculated distortion correction coefficient for the digital orthogonal baseband signals I' and Q' whose amplitude has been limited by amplification limitation circuit 22.

DAC 25 converts digital orthogonal baseband signals I" and Q" for which the distortion compensation computation has been performed by nonlinear distortion correction computation unit 24 into analog signals and outputs them as analog orthogonal baseband signals.

Reference signal generation unit 27 generates a reference signal.

Orthogonal modulator 26 converts the analog orthogonal baseband signals converted by DAC 25 into orthogonal modulation signals based on the reference signal outputted from reference signal generation unit 27.

Power amplifier 28 amplifies the powers of the orthogonal modulation signals that are converted by orthogonal modulator 26 and outputs them as an RF (Radio Frequency) signal.

Directional coupler 29 feeds back part of the output of power amplifier 28 to orthogonal demodulator 30.

Orthogonal demodulator 30 demodulates part of the output of power amplifier 28 fed back by directional coupler 29 to analog orthogonal baseband signals based on the reference signal outputted from reference signal generation unit 27.

ADC 31 converts the analog orthogonal baseband signals demodulated by orthogonal demodulator 30 into digital signals and outputs them as digital orthogonal baseband feedback signals Ib and Qb.

Sampling circuit 12 samples digital orthogonal baseband feedback signals Ib and Qb outputted from ADC 31 and digital orthogonal baseband transmission signals I' and Q' outputted from amplification limitation circuit 22.

Envelope detection circuit 13 detects the envelopes of the digital orthogonal baseband feedback signals Ib and Qb and the digital orthogonal baseband transmission signals I' and Q' based on data sampled by sampling circuit 12.

Power calculation unit 23 calculates the powers of the digital orthogonal baseband signals I' and Q' outputted from amplification limitation circuit 22.

Error calculation and distortion correction coefficient update unit 33 compares the envelopes of the digital orthogonal baseband feedback signals Ib and Qb with those of the digital orthogonal baseband transmission signals I' and Q', the envelopes having been detected by envelope detection circuit 13, and updates the distortion correction coefficient based on the comparison result.

Nonlinear distortion correction computation unit 24 refers to the distortion correction coefficient updated by error calculation and distortion correction coefficient update unit 33 with an address of the power values outputted from power calculation unit 23 and performs the distortion correction computation using a complex-multiplication based on the distortion correction coefficient so as to accomplish optimum distortion correction.

Since sampling circuit 12 performs the foregoing operation, even if the transmission signal has an intermittent transmission pattern, since sampling circuit 12 can securely sample the transmission signal in an optimum processing period, adaptive distortion correction can be optimally accomplished.

The foregoing structure is just an example of the present invention and therefore a structure using digital orthogonal modulation and digital orthogonal demodulation or a structure using a frequency converter rather than the direct modulation can be used. Alternatively, a structure that performs a distortion correction computation with an address of an amplitude value that is a square of the power values outputted from the amplitude computation unit instead of an address of the power values outputted from power calculation unit 23 can be used.

Now, the present invention has been described with reference to the embodiments. However, it should be understood by those skilled in the art that the structure and details of the present invention may be changed in various manners without departing from the scope of the present invention.

According to the foregoing embodiment, an example in which a baseband signal containing a reference signal is sampled was described. The present invention is not limited to such an example. Alternatively, as long as a transmission signal containing a signal transmitted in a regular and intermittent transmission pattern is present, the present invention can be applied to sampling for the transmission signal. In particular, the present invention is suitable for OFDMA modulation scheme communication technologies (for example, LTE and WiMAX). In this case, by setting up sampling acquisition intervals corresponding to the regularity, the same effect can be obtained.

According to the foregoing embodiment, an example in which the sampling process is determined by calculating the average power value of sampled data and comparing the average power value with the power threshold was described. The present invention is not limited to such an example, instead, the sampling process can be determined by calculating the average amplitude value of sampled data and comparing the average amplitude value with the amplitude threshold.

In addition, the method performed by sampling circuit 12 in the communication device according to the present invention can be applied to a program that causes a computer to execute the method. Alternatively, the program can be stored in a storage medium and is also provided to the outside through a network.

The present application claims priority based on Japanese Patent Application JP 2009-209216 filed on Sep. 10, 2009, the entire contents of which being incorporated herein by reference in its entirety.

The invention claimed is:

1. A distortion correction circuit that corrects distortion that occurs in a power amplifier, comprising:
   an amplification limitation circuit that limits an amplitude of an input transmission signal such that the amplitude becomes equal to or lower than a predetermined power threshold, the transmission signal including a particular transmission signal transmitted in a regular and intermittent transmission pattern;
   a signal processing circuit that corrects distortion of the transmission signal, wherein the transmission signal's amplitude is limited by said amplification limitation circuit based on a pre-calculated distortion correction coefficient;
   a sampling circuit comprising:
      a sampling processing unit that performs a sampling process that samples said transmission signal whose amplitude is limited by said amplification limitation circuit and a feedback signal in which part of the transmission signal, whose power is amplified, is output by a power amplifier;
      a determination unit that determines whether said sampling process has been successfully or unsuccessfully performed; and
      a sampling control unit that sets up sampling acquisition intervals for said sampling processing unit in which the intervals differ depending on whether said sampling process was successful or unsuccessful; and
   an envelope detection circuit that detects envelopes of the transmission signal and the feedback signal based on data sampled by said sampling circuit,
   wherein said sampling processing unit performs the sampling process based on the sampling acquisition interval that is set up by said sampling control unit, and
   wherein said signal processing circuit updates said distortion correction coefficient based on the envelopes of the transmission signal and the feedback signal detected by said envelope detection circuit and corrects distortion based on said updated distortion correction coefficient.

2. The distortion correction circuit as set forth in claim 1, wherein if said sampling process has been successfully performed, said sampling control unit sets up said sampling acquisition interval for a period in which said particular transmission signal has been regularly mapped in said transmission pattern.

3. The distortion correction circuit as set forth in claim 2, wherein said communication device uses OFDMA (Orthogonal Frequency Division Multiple Access) modulation scheme,
   wherein said particular transmission signal is mapped to the same symbol positions of each slot that composes an OFDMA subframe, and
   wherein if said sampling process has been successfully performed, said sampling control circuit sets up said sampling acquisition interval for an interval of symbols of one slot.

4. The distortion correction circuit as set forth in claim 2, wherein said communication device uses OFDMA modulation scheme,
   wherein said particular transmission signal is mapped to the same symbol positions of each even-numbered slot that composes an OFDMA subframe, and
   wherein said particular transmission signal is mapped to the same symbol positions of each odd-numbered slot that composes the OFDMA subframe, and
   wherein if said sampling process has been successfully performed, said sampling control unit sets up said sampling acquisition interval for an interval of symbols of two slots.

5. The distortion correction circuit as set forth in claim 1, wherein if an average power value of data sampled by said sampling process is equal to or greater than a preset threshold, said determination unit determines that said sampling process has been successfully performed and if said average power value is smaller than said threshold, said determination unit determines that said sampling process has been unsuccessfully performed.

6. The distortion correction circuit as set forth in claim 1, wherein if an average amplitude value of data sampled by said sampling process is equal to or greater than a preset threshold, said determination unit determines that said sampling process has been successfully performed and if said average amplitude value is smaller than said threshold, said determination unit determines that said sampling process has been unsuccessfully performed.

7. The distortion correction circuit as set forth in claim 1, wherein if said sampling process has been unsuccessfully performed a predetermined number of times in succession, said sampling control unit causes said sampling processing unit to forcibly terminate said sampling process.

8. The distortion correction circuit as set forth in claim 1 wherein said signal processing circuit comprises:
   a power calculation unit that calculates a power of the transmission signal whose amplitude has been limited by said amplification limitation circuit;
   an error calculation and distortion correction coefficient update unit that updates said distortion correction coefficient based on the envelopes of the transmission signal and the feedback signal detected by said envelope detection circuit; and
   a nonlinear distortion correction computation unit that refers to the distortion correction coefficient updated by said error calculation and distortion correction coefficient update unit with an address of the power value outputted from said power calculation unit and performs a distortion correction computation using a complex-multiplication based on the distortion correction coefficient for the transmission signal whose amplitude has been limited by said amplification limitation circuit.

9. The distortion correction circuit as set forth in claim 1, further comprising:
   a directional coupler that feeds back part of the transmission signal whose power has been amplified and that has been outputted by said power amplifier;

an orthogonal demodulator that orthogonally demodulates part of the transmission signal fed back by said directional coupler; and an ADC that converts the transmission signal demodulated by said orthogonal demodulator into a digital signal and inputs the converted signal as a feedback signal to said sampling circuit, wherein said sampling circuit samples the feedback signal outputted from said ADC and the transmission signal outputted from said amplification limitation circuit, wherein said envelope detection circuit detects the envelopes of the transmission signal and the feedback signal based on data sampled by said sampling circuit, and wherein said signal processing circuit compares the envelopes of said feedback signal and said transmission signal detected by said envelope detection circuit and updates said distortion coefficient based on the comparison result.

10. A communication device comprising:

a distortion correction circuit as set forth in claim 1;

a transmission data generation unit that generates a transmission signal and inputs the transmission signal to said amplification limitation circuit of said distortion correction circuit;

a reference signal generation unit that generates a reference signal;

an orthogonal modulator that orthogonally modulates the transmission signal for which a distortion correction computation has been performed and that has been converted into an analog signal by said signal processing circuit of said distortion correction circuit based on the reference signal outputted from said reference signal generation unit; and a power amplifier that amplifies a power of the transmission signal orthogonally modulated by said orthogonal modulator and outputs the transmission signal as an RF signal.

11. A communication device comprising:

a distortion correction circuit as set forth in claim 10;

a transmission data generation unit that generates a transmission signal and inputs the transmission signal to said amplification limitation circuit of said distortion correction circuit;

a reference signal generation unit that generates a reference signal;

an orthogonal modulator that orthogonally modulates the transmission signal for which a distortion correction computation has been performed and that has been converted into an analog signal by said nonlinear distortion correction computation unit of said distortion correction circuit based on the reference signal outputted from said reference signal generation unit; and a power amplifier that amplifies a power of the transmission signal orthogonally modulated by said orthogonal modulator and outputs the transmission signal as an RF signal, wherein said sampling circuit samples a feedback signal in which part of the output of said power amplifier has been fed back, orthogonally demodulated, and converted into a digital signal, wherein said envelope detection circuit detects an envelop of said feedback signal based on data sampled by said sampling circuit, and wherein said error calculation and distortion correction coefficient update unit compares the envelopes of said feedback signal and said transmission signal detected by said envelope detection circuit and updates said distortion coefficient based on the comparison result.

12. A distortion correction method that corrects distortion that occurs in a power amplifier, comprising:

limiting an amplitude of an input transmission signal such that the amplitude becomes equal to or lower than a predetermined power threshold, the transmission signal including a particular transmission signal transmitted in a regular and intermittent transmission pattern;

performing signal processing that corrects, based on a pre-calculated distortion correction coefficient, distortion of the transmission signal whose amplitude has been limited;

performing a sampling process that samples the transmission signal whose amplitude has been limited and a feedback signal in which part of the transmission signal, whose power has been amplified, has been outputted by a power amplifier;

determining whether said sampling process has been successfully or unsuccessfully performed;

setting up sampling acquisition intervals for said sampling process in which the intervals differ depending on whether said sampling process is successfully or unsuccessfully; and detecting envelopes of the transmission signal and the feedback signal based on data sampled by said sampling process, wherein said sampling process is performed based on the sampling acquisition interval that has been set up, and wherein the signal processing includes:
updating said distortion correction coefficient based on the detected envelopes of the transmission signal and the feedback signal; and
correcting distortion based on said updated distortion correction coefficient.

13. The distortion correction method as set forth in claim 12, wherein said signal processing comprises:

calculating a power of the transmission signal whose amplitude has been limited;

referring to the updated distortion correction coefficient with an address of the calculated power; and performing a distortion correction computation using a complex-multiplication based on the distortion correction coefficient for the transmission signal whose amplitude has been limited.

14. The distortion correction method as set forth in claim 12, further comprising:

feeding back part of the transmission signal whose power has been amplified and that has been outputted by said power amplifier;

orthogonally demodulating part of the transmission signal which has been fed back; and converting the demodulated transmission signal into a digital signal and inputting the converted signal as a feedback signal to said sampling process, wherein said sampling process comprises sampling the digital signal as the feedback signal and the transmission signal whose amplitude has been limited, and wherein said signal processing includes:
comparing the detected envelopes of said feedback signal and said transmission signal; and
updating said distortion coefficient based on the comparison result.

* * * * *